United States Patent [19]

Nelli et al.

[11] Patent Number: 5,508,906
[45] Date of Patent: Apr. 16, 1996

[54] LOW LOSS RECIRCULATION APPARATUS

[75] Inventors: Christopher J. Nelli, Schaumberg; Marc D. Singer, Northbrook; Gregory W. Flolid, Gurnee, all of Ill.

[73] Assignee: Motorola, Inc., Schaumburg, Ill.

[21] Appl. No.: 443

[22] Filed: Jan. 4, 1993

[51] Int. Cl.⁶ .................................................. H02M 3/135
[52] U.S. Cl. .............................. 363/97; 363/98; 361/154; 318/434
[58] Field of Search .................................. 363/97, 98, 58; 361/154, 87, 31; 318/434, 811; 323/282, 351

[56] References Cited

U.S. PATENT DOCUMENTS

| | | | |
|---|---|---|---|
| 4,820,986 | 4/1989 | Mansfield et al. | 324/320 |
| 4,827,366 | 5/1989 | McNally et al. | 361/18 |
| 4,841,166 | 6/1989 | Harnden | 307/246 |
| 4,859,916 | 8/1989 | McCambridge | 318/293 |
| 4,916,378 | 4/1990 | Marchio et al. | 323/222 |
| 4,962,346 | 10/1990 | Maggioni et al. | 307/270 |
| 5,012,381 | 4/1991 | Elliott et al. | 361/84 |
| 5,038,247 | 8/1991 | Kelly et al. | 361/154 |
| 5,109,162 | 4/1992 | Koch et al. | 307/127 |
| 5,111,123 | 5/1992 | Hach et al. | 318/434 |
| 5,341,282 | 8/1994 | Brambilla et al. | 363/50 |

*Primary Examiner*—Peter S. Wong
*Assistant Examiner*—Adolf Berhane
*Attorney, Agent, or Firm*—Nicholas C. Hopman

[57] ABSTRACT

A low loss recirculation apparatus for recirculating current through an inductive load (101) includes an active recirculation circuit. The low loss recirculation apparatus includes a control device (201) with a drive output (203) that provides a drive signal (205), and a recirculate output (207) that provides a recirculation signal (209). A device (103) provides drive current, along a path (109), to the inductive load (101) responsive to the drive signal (205). A gated recirculation circuit (202), recirculates current, along a path (115), through the inductive load (101) responsive to the recirculation signal (209).

4 Claims, 4 Drawing Sheets

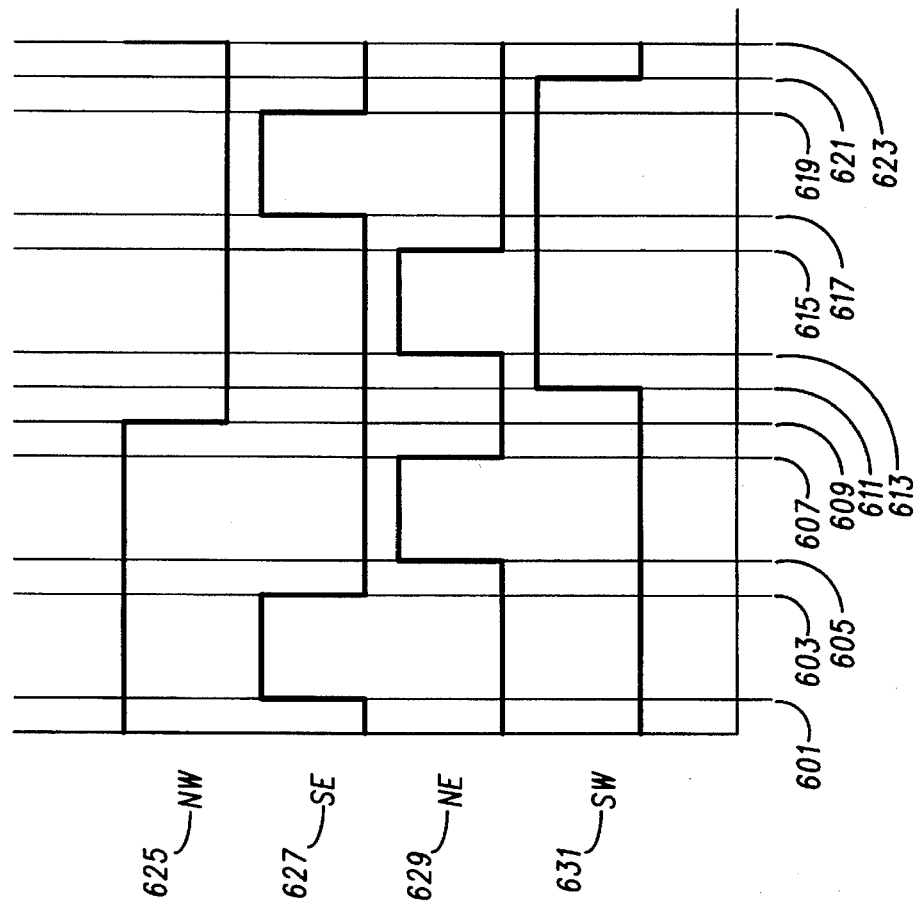

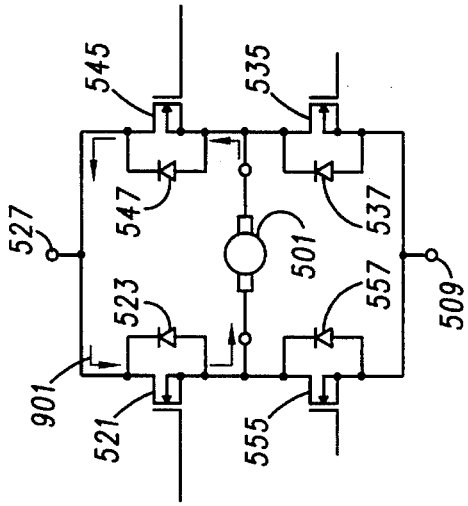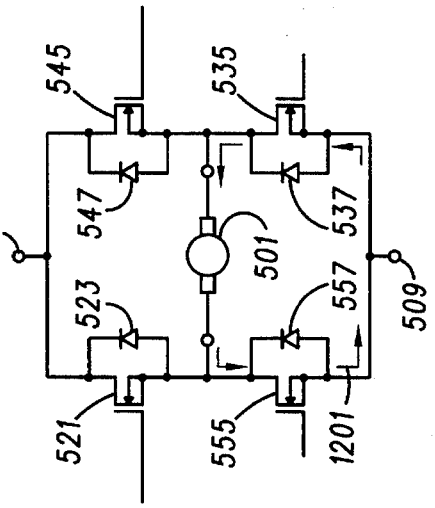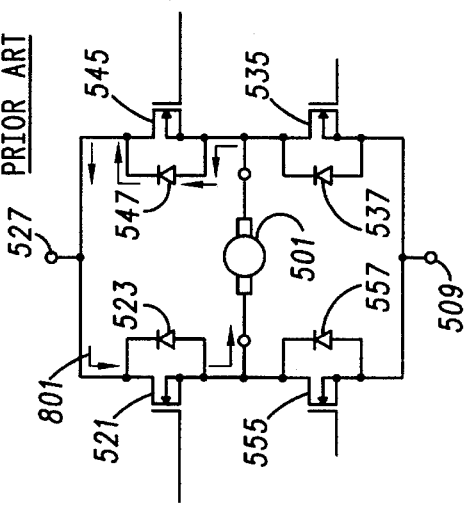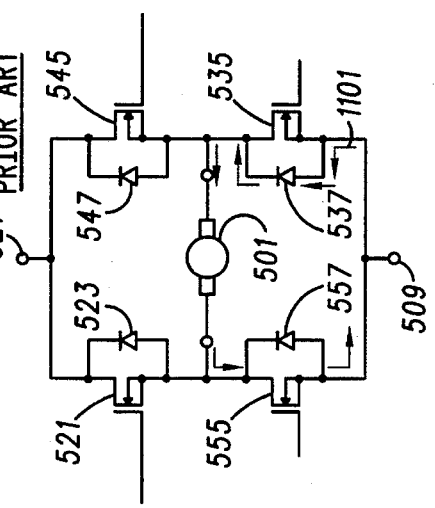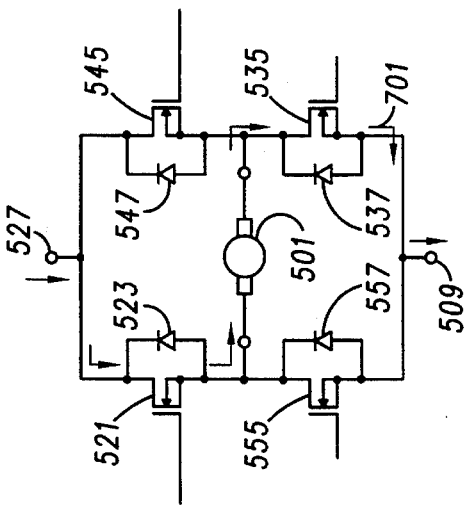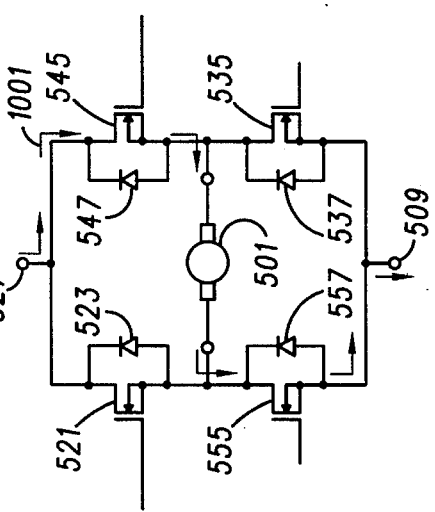

LOW LOSS RECIRCULATION APPARATUS

FIELD OF THE INVENTION

This invention is generally directed to the field of inductive load based drive circuits, and particularly to drive circuits for recirculating current in an inductive load.

BACKGROUND OF THE INVENTION

Many contemporary inductive load drivers that provide drive current from a power supply include provision for periodically recirculating current in an inductive load. This is in order to reduce power dissipation of the driver while maintaining operative current through the load, and also to optimize the physical performance of the load. These loads may include direct current motors, electromechanical solenoids, electromechanical actuators, and other inductive loads. These loads are typically energized by a drive circuit that provides current to the particular load. Drive circuits, or drivers, come in many varieties ranging from simple solenoid drivers to complex bridge circuits. The more complex circuits not only activate and deactivate the load but control it's action precisely to overcome inherent mechanical deficiencies. Some of these drivers have the capability to recirculate current through the load to effectively prolong the drive action after the drive current provided from the power supply is removed.

Referring to FIG. 1, a prior art inductive load driver is shown. A control module 100 has an output 102 that provides a control signal 104 with a drive state 106 and a recirculation state 108. An inductive load 101 is provided drive current from a power supply terminal 105, through a transistor 103 along a drive path 109, to a second power supply terminal 111. This action is controlled by the drive state 106 of the control signal 104 provided at an input, or control terminal 107 from the control module 100.

When this path 109 is deactivated, by applying recirculation state 108 of the control signal 104 at terminal 107, the transistor 103 is turned off and a recirculating path 115 is invoked. This recirculating path 115 includes the inductive load 101 and a conducting diode 113. Because, under this circumstance, the diode 113 has a forward voltage drop, the diode 113 will dissipate power while the recirculating current is active. For small currents this is generally not a significant issue. However, with inductive loads that require larger drive currents, thereby larger recirculating currents, this power dissipation becomes a very significant problem. For instance with a recirculation current of 100 amps, and a forward voltage drop of 1.0 volts the power dissipation requirement for the diode 113 is 100 amps * 1.0 volts, or 100 watts.

The power dissipation, created by the forward voltage drop across the diode 113, will cause the diode's 113 temperature to rise significantly. This is problematic because it will cause heating of adjacent components, and significantly reduce the reliable life of the diode 113. The diode recirculation scheme also adds unnecessary component cost and detracts from available space. Additionally, since the diode 113 has a significant forward voltage drop, the recirculation efficiency is impaired.

What is needed is an improved driver for recirculating current through an inductive load that has a lower cost, a higher field reliability, a smaller size, is more efficient, and has significantly lower power dissipation.

BRIEF DESCRIPTION OF THE DRAWINGS

FIG. 6 is an illustration of various signal waveforms that correspond to the circuit operation of FIG. 5;

FIG. 7 is a schematic diagram illustrating a first drive current path in a simplified schematic of the bridge circuit introduced in FIG. 5;

FIG. 8 is a schematic diagram illustrating a prior art recirculation current path in a simplified schematic of the bridge circuit introduced in FIG. 5;

FIG. 9 is a schematic diagram illustrating a first recirculation current path in accordance with the invention;

FIG. 10 is a schematic diagram illustrating a second drive current path in a simplified schematic of the bridge circuit introduced in FIG. 5;

FIG. 11 is a schematic diagram illustrating a prior art recirculation current path in a simplified schematic of the bridge circuit introduced in FIG. 5; and FIG. 12 is a schematic diagram illustrating a second recirculation current path in accordance with the invention.

DETAILED DESCRIPTION OF A PREFERRED EMBODIMENT

In a preferred embodiment a low loss recirculation apparatus, for recirculating current through an inductive load, includes an active, or gated, recirculation circuit that has a significantly lower power dissipation than the prior art scheme. The low loss recirculation apparatus includes a control device with a drive output that provides a drive control signal, and a recirculation output that provides a recirculation signal. A device provides drive current to an inductive load responsive to the drive signal. A gated recirculation circuit, recirculates current through the inductive load responsive to the recirculation signal. Additionally, a passive recirculation circuit can be added to recirculate current through the load only when the drive current and the gated recirculation circuit both are not providing or recirculating current to the load.

Figures 1, 2, 3:
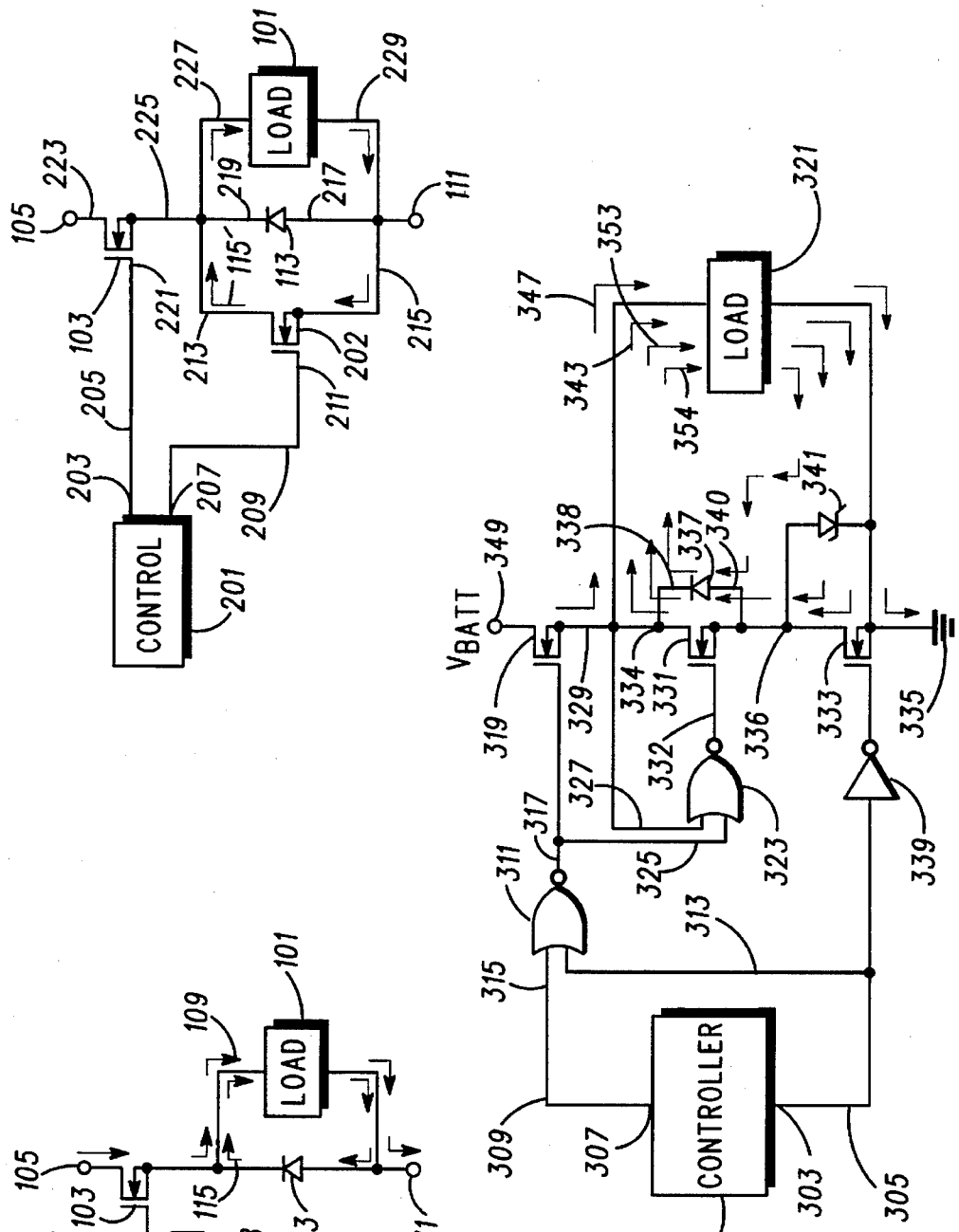
FIG. 1 is a schematic diagram showing a prior art inductive load driver with a diode based recirculation circuit.
FIG. 2 is a schematic diagram showing an improved inductive load driver with a low loss active recirculation circuit in accordance with the invention.
FIG. 3 is a schematic diagram showing an improved inductive load driver having multiple low loss recirculation paths in accordance with an alternative embodiment of the invention.

Referring to FIG. 2, an active device 202, preferably a three terminal field effect transistor, is part of gated recirculation means and has been added across the inductive load 101 to conduct the recirculating current along a path 115'. The field effect transistor 202 has a control, or gate input 211, and two current conducting output terminals, a drain 213, and a source 215.

Additionally, a control module 201 has been added. This control module 201 has a drive output 203 for providing a drive signal 205, and a recirculate output 207 for providing a recirculation signal 209. These signals 205 and 209 are provided in an exclusive manner to prevent cross conduction between the drive transistor 103 and the recirculation transistor 202. In this circuit a new path 115' for recirculating current flow includes only the inductive load 101, and the recirculation transistor 202. This path 115' is invoked with the recirculate signal 209 gating the recirculation transistor 202 on during the time that the signal 205 is turned off.

Of course, other circuit elements may be substituted for the transistor 202, if desired. By selecting the recirculation transistor 202 with a low Rds-on, or drain-to-source on resistance, very low power dissipation can be expected. Returning to the previous example, if the recirculation current is 100 amps and Rds-on is 0.01 ohms then power is 100 amps * 0.01 ohms, or 1 watt. This results in a significantly lower power dissipation in the recirculation current path. Because of this, higher field reliability can be expected. Additionally, field effect transistors may be wired in parallel, further reducing the power dissipation.

Also, since the forward voltage drop in the recirculation transistor 202 is lower than the prior art diode 113, the current can recirculate slower—thus longer making this a more drive efficient approach to recirculating current in an inductive load.

Additionally, a passive recirculation means, in this case the diode 113 may be coupled across the inductive load 101 for passively recirculating current while neither the drive transistor 103 or the recirculation transistor 202 are providing a current path to the load. This ensures a smooth transition in the current when transitioning between driving current and actively recirculating current. This is important to certain types of inductive loads.

This approach to recirculation has application in many other, more complex circuit applications as well. Some of these will be described next.

Figure 4:
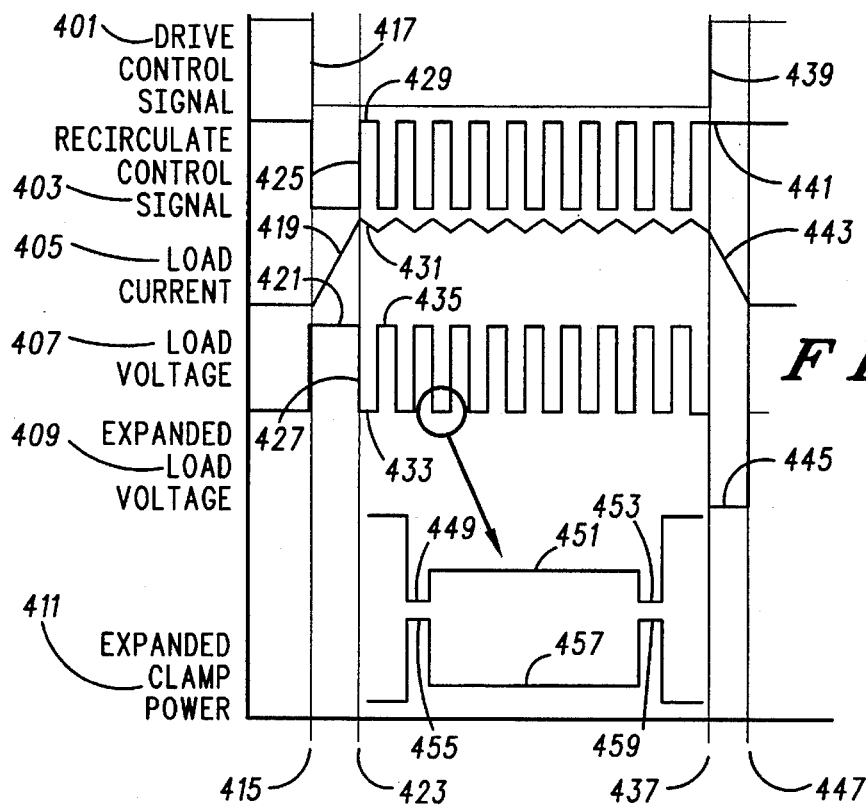
FIG. 4 is an illustration of various signal waveforms that correspond to the circuit operation of FIG. 3.

In FIG. 3 a schematic diagram shows an improved inductive load driver with multiple low loss recirculation paths. The illustration of FIG. 4 shows various signal waveforms that correspond to the circuit operation of FIG. 3, and will be referred to after the circuit elements are introduced in FIG. 3. Principally, this embodiment uses a diode in parallel with a field effect transistor to implement both a drive efficient and a power efficient design solution.

A controller 301 has a drive output 303 that provides a drive control signal 305, and a recirculate output 307 that provides a recirculate control signal 309. Means for providing drive current include a logical NOR gate 311, and a drive transistor 319. The purpose of this logical NOR gate 311 is to switch off drive current during recirculation by gating off the transistor 319. The logical NOR gate 311 has two inputs 313 and 315 that are connected to the drive control signal 305, and the recirculate control signal 309 correspondingly. An output, 317 of the logical NOR gate 311 drives both the drive transistor 319, and an input 325 of another logical NOR gate 323. Another input 327 of the logical NOR gate 323 is coupled to an output 329 of the transistor 319. The purpose of this connection between 327 and 329, and the logical NOR gate 323, is to prevent the turn-on of a first recirculation transistor 331 before the transistor 319 has stopped providing drive current along a drive path 347. This path 437, includes a first power terminal 349 the drive transistor 319, an inductive load 321, and a second power terminal 335. An inverter 339 is connected to the drive output 303 of the controller 301 for providing the proper state of the drive control signal 305 to another recirculation transistor 333. The purpose of this transistor 333 is to short-out a zener diode 341 to provide a slow recirculation path 343 so that the energy in the inductive load 321 dissipates slowly. When the zener diode 341 is in the circuit, a fast recirculation path 354 recirculates current through the inductive load 321.

As mentioned earlier, FIG. 4 shows several key waveforms representing certain signals in the circuit detailed in FIG. 3. Signal 401 represents the drive control signal 305. Signal 403 represents the recirculate control signal 309. Signal 405 represents a current in the inductive load 321 under various operating conditions. Signal 407 represents a voltage across the load under various operating conditions. Signal 409 represents an expanded scale of one of the individual low voltage state waveforms from signal 407. Signal 411 shows the corresponding power dissipated by the components actively connected across the inductive load 321 during the time this waveform 409 is active. These include, at depending on the drive signal 305, and the recirculation signal 309, the recirculating transistor 331, the other recirculating transistor 333, the diode 337, and the zener 341.

At a time represented by the line labeled 415 the controller 301 provides an active low state for the drive control signal 305 as shown by reference number 417. This denotes the start of a drive cycle. This enables the logical NOR gate 311 to turn on the drive transistor 319. This drive transistor 319 provides current from the first power, or battery positive, terminal 349, to the inductive load 321 along a path 347 including the second power, or battery negative, terminal 335. Because of this, the current in the inductive load 321, or load current, 405 begins to build up from a low level to a higher level as shown by reference number 419. Also, the load voltage 407 remains at a battery voltage, or about 12 volts.

At a time represented by the line labeled 423, the controller 301 provides an active high state recirculate control signal 305 as shown by reference number 425. This signal 305 when processed by the logical NOR gate 311 turns off the drive transistor 319. This cuts off the provided current and allows the load current 405 to fall, as shown by reference number 431. Also the load voltage drops significantly as shown by reference number 427. The purpose of this action is regulation. Those skilled in the art will recognize that this can be accomplished by various open or closed loop techniques. The recirculation transistor 333 is already on because of the drive signal 305 and the logic of the inverter 339. Because of this, a current in the load starts to recirculate along a path 353 including the inductive load 321, the other recirculation transistor 333 and a diode 337. This diode 337 is employed to start the recirculation process before the drive transistor 319 is completely cutoff. The resulting load voltage, and clamp power, including both the other recirculation transistor 333 and the diode 337 is shown by reference numbers 449 and 455. In this case it's 1.5 volts and 4.5 watts correspondingly, based on a recirculation current of 3 amps. The high power dissipation is because of the diode 337 forward voltage drop. However, this is a peak power and when integrated over time this power is much lower.

As time progresses, since the voltage 329, at the input 327 of the other logical NOR gate 323 has fallen, the other logical NOR gate 323 will turn on the recirculation transistor 331. As a result of this action, the load voltage and damp power will drop significantly. This happens because the recirculation path 343 now eliminates the diode 337 and substitutes the recirculation transistor 331. Now the recirculation path 343 includes the inductive load 321, the other recirculation transistor 333, and the recirculation transistor 331. The resulting load voltage, and damp power, is shown by reference numbers 451 and 457. In this case it's 0.5 volts and 1.5 watts correspondingly. The low power dissipation is because of the small forward voltage drop across both of the transistors 331 and 333. Of course, much lower Rds-on transistors can be used to drop the voltage and resulting dissipation even lower.

This two path process 353, 343 is applied to limit cross conduction between the battery terminals 349 and 335 by partially conducting transistors, 319 and 331. A benefit of this approach is that current is sustained more efficiently because of the temporary recirculation path 353.

As the recirculate control signal 403 returns to its opposite state the recirculation transistor 331 will stop conducting, due to the logical NOR gate 323 action. Because of this the recirculation current path 343 will cease to flow. The recirculation path will then revert to the less efficient path 353. The resulting increase in load voltage, and clamp power, is shown by reference numbers 453 and 459.

Then reference number 437 shows the ending of the drive cycle. The drive control signal 401 is inactive as, shown by reference number 439. The recirculate control signal transits inactive, as shown by reference number 441. The load current 405 starts to decay, as shown by reference number 443, and the load voltage 407 is allowed to flyback to a voltage determined by the breakdown voltage of the zener 341, as shown by reference number 445. This is because the other recirculation transistor 333 is deactivated. During the period between reference number 437 and reference number 447, while the load current 405 is decaying, it is flowing through recirculation path 354.

The advantage in this embodiment over the prior art is the application of the active recirculation control approach to a more complex inductive load driver. This approach includes the recirculation diode 337 to sustain the drive action while any cross conduction conditions are prevented. The small added power dissipation for this feature is offset by the benefit of the sustained drive action. Of course, all of the earlier stated advantages enjoyed by the preferred embodiment apply here as well.

Figure 5:
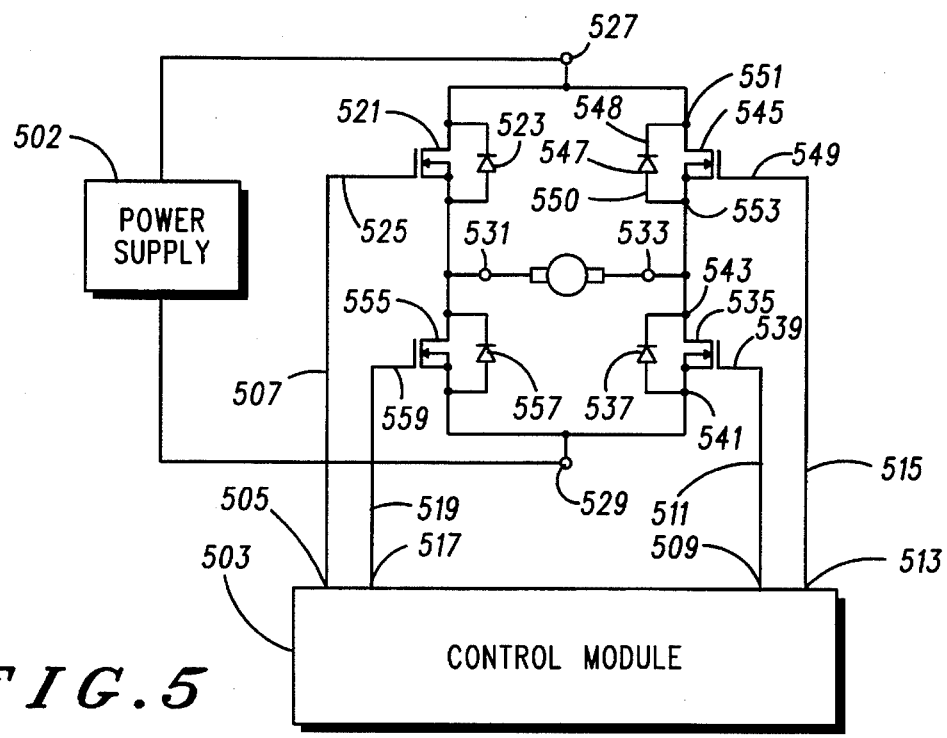
FIG. 5 is a schematic diagram of a bridge type configuration of an improved inductive load driver with a low loss active recirculation circuit in accordance with an alternative embodiment of the invention.

In another embodiment an inductive bridge driver is detailed in FIG. 5 with corresponding waveforms represented in FIG. 6. In this embodiment a direct current motor 501 represents the inductive load. Principally, this embodiment uses the bi-directional conduction capability of a field effect transistor to implement a power efficient and cost efficient design solution. The bridge circuit is constructed as follows.

A power supply 502 has a first power terminal 527 and a second power terminal 529, for supplying current to the direct current motor 501. Since this embodiment fits into an automotive application the power supply 502 is simply an automotive battery.

A control module 503 has a first output 505 that provides a northwest control signal 507. Note that for convenience, compass direction terminology is used to identify the relative architectural locations of elements of the bridge. The control module 503 also has a second output 509 that provides a southeast control signal 511. Also, the control module 503 also has a third output 513 that provides a northeast control signal 515. Additionally, the control module 503 has and fourth output 517 that provides a southwest control signal 519. In this embodiment a Motorola MC68HC11 microcontroller is embedded in the control module 505 and is firmware microcoded to provide the corresponding control signals, 507, 511, 515, and 519. Of course, those of ordinary skill in the art will recognize many other equivalent apparatus and methods for providing these control signals.

A northwest transistor means is provided, preferably consisting of a northwest transistor 521, and a northwest flyback clamp diode 523, connected in parallel. The northwest transistor has a gate 549, a drain 551, and a source 553. A diode 547 has a cathode 548, connected to the drain 551, and an anode 550, connected to the source 553. The northwest transistor 521 has a northwest control input 525 coupled to the first output 505 of the control module 503. The northwest transistor means 521, 523 is coupled to the first power terminal 527 of the power supply 502. This northwest transistor means 521, 523 is also coupled to a first 531 of the two terminals of the direct current motor 501. The northwest transistor means 521, 523 provides current from the first power terminal 527 of the power supply 502 to the first 531 of the two terminals of the direct current motor 501, responsive to the northwest control signal 507 at the northwest control input 525.

A southeast transistor 535, preferably shunted with a diode 537 for carrying a temporary recirculation current and limiting the flyback voltage before an active recirculation path is invoked, has a southeast control input 539 coupled to the second output 509 of the control module 503. The southeast transistor 535 also has a southeast power input terminal 541 coupled to the second power terminal 529 of the power supply 502, and a southeast power output terminal 543 coupled to a second 533 of the two terminals of the direct current motor 501. The southeast transistor 535 either provides current from the second 533 of the two terminals of the direct current motor 501 via the southeast power output terminal 543 via the southeast power input terminal 541 to the second power terminal 529 of the power supply 502, or provides current from the southeast power input terminal 541 via the southeast power output terminal 543 to the second 533 of the the two terminals of the direct current motor 501, both responsive to the southeast control signal 511 at the southeast control input 539.

A northeast transistor 545, preferably shunted with a diode 547 for carrying a temporary recirculation current and limiting the flyback voltage before an active recirculation path is invoked, has a northeast control input 549 coupled to the third output 513 of the control module 503. The northeast transistor 545 also has a northeast power input terminal 551 coupled to the first power terminal 527 of the power supply 502, and a northeast power output terminal 553 coupled to the second 533 of the two terminals of the direct current motor 501. The northeast transistor 545 either provides current from the first power terminal 527 of the power supply 502 via the northeast power input terminal 551 via the northeast power output terminal 553 to the second 533 of the two terminals of the direct current motor 501, or provides current from the second 533 of the two terminals of the direct current motor 501 via the northeast power output terminal 553 to the northeast power input terminal 551, both responsive to the northeast control signal 515 at the northeast control input 549.

A southwest transistor means is provided, preferably consisting of a southwest transistor 555, and a southwest flyback clamp diode 557, connected in parallel. The southwest transistor 555 has a southwest control input 559 coupled to the fourth output 517 of the control module 503. The southwest transistor means 555, 557 is coupled to the second power terminal 529 of the power supply 502. This southwest transistor means 555, 557 is also coupled to the first 531 of the two terminals of the direct current motor 501.

The southwest transistor means 555, 557 provides current from the first 531 of the two terminals of the direct current motor 501 to the second power terminal 529 of the power supply 502, responsive to the southwest control signal 519 at the southwest control input 559.

Now that the circuit architecture has been detailed, the actual operation of the improved bridge circuit can be detailed.

Referring to FIGS. 7 through 12 several important current provision and recirculation paths are presented. Note that these illustrations only show a subset of the bridge circuit presented in FIG. 5. It is assumed that the requisite control signals are applied to each of the transistors to invoke the current paths shown.

In FIG. 7 a schematic diagram illustrates a first drive current path 701. When this path is invoked the direct current motor 501 will rotate in a first direction.

FIG. 8 a schematic diagram illustrates a prior art recirculation current path 801. Because the recirculation diode 547 conducts the recirculating current this case suffers from the aforementioned power inefficiency.

FIG. 9 a schematic diagram illustrates a first recirculation current path, using the new approach. Since the diode 547 is no longer conducting and transistor 545 is, the power dissipation is significantly reduced and the current recirculates slower—thus taking longer to decay than in the prior art case.

FIG. 10 a schematic diagram illustrates a second drive current path. When this path is invoked the direct current motor 501 will rotate in a second direction.

FIG. 11 a schematic diagram illustrates a prior art recirculation current path. Because the recirculation diode 537 conducts the recirculating current this case suffers from the same power inefficiency, as shown in FIG. 8.

FIG. 12 a schematic diagram illustrates a second recirculation current path, using the new approach. Since the diode 537 is no longer conducting and transistor 535 is, the power dissipation is significantly reduced.

Referring to FIG. 6 the operation of the circuit in FIG. 5 can be described. The four waveforms of the signals shown NW 625, SE 627, NE 629, and SW 631 correspond to the four signals from FIG. 5 507, 511,515, and 519 provided by the control module 503.

The NW waveform 625 represents the northwest control signal 507 that drives the northwest transistor 521. Between reference numbers 601 and 609 the northwest transistor 521 is turned on. This is in support of the current path 701 for providing current to direct current motor 501, as previously shown in FIG. 7, and for providing a recirculation path 901 as shown in FIG. 9.

The SE waveform 627 represents the southeast control signal 511 that drives the southeast transistor 535. Between reference numbers 601 and 603 the southeast transistor 535 is turned on. This is in support of the current path 701 for providing current to direct current motor 501, as previously shown in FIG. 7. In this case the southeast transistor 535 conducts current from its drain to its source to provide a return path to the power supply terminal 529.

The NE waveform 629 represents the northeast control signal 515 that drives the northeast transistor 545. Between reference numbers 605 and 607 the northeast transistor 545 is turned on. Note that the control module 503 purposely did not overlap the SE 627, and the NE 629 waveforms as shown between reference numbers 603 and 605. This is to prevent any potential cross conduction between the northeast transistor 545 and the southeast transistor 535. During this time the diode 547 carries a temporary recirculation current and limits the flyback voltage before an active recirculation path is invoked. Then a recirculation path 901, shown in FIG. 9 is invoked. Since the northeast transistor 545 has significantly less loss than the prior art diode 547 power dissipation is minimized.

At reference number 609 the northwest control signal 507, or NW waveform 625 transits to an inactive state.

The SW waveform 631 represents the southwest control signal 519 that drives the southwest transistor 555. Between reference numbers 611 and 621 the southwest transistor 555 is turned on. This is in support of the current path 1001 for providing current to direct current motor 501, as previously shown in FIG. 10, and for providing a recirculation path 1201 as shown in FIG. 12.

Between reference numbers 613 and 617 the northeast transistor 545 is again turned on, via waveform 629. In this case, the drive current path 1001 is completed between the power supply 502 terminals 527, and 529. In this case the northeast transistor 545 conducts current from its source to its drain to provide current from the terminal 527 to the direct current motor terminal 533.

Between reference numbers 617 and 619 the southeast transistor 535 is again turned on via waveform 627. Note that the control module 503 purposely did not overlap the SE 627, and the NE 629 waveforms as shown between reference numbers 615 and 617. This is to prevent any potential cross conduction between the northeast transistor 545 and the southeast transistor 535. During this time the diode 537 carries a temporary recirculation current and limits the flyback voltage before an active recirculation path is invoked. When the southeast transistor 535 is turned on the recirculation path 1201 is invoked as shown in FIG. 12. Since the southeast transistor 535 has significantly less loss than the prior art diode 537 power dissipation is minimized.

The advantage in this embodiment is the use of the same transistor for both a current providing element and a low loss current recirculating element. Of course, all of the earlier stated advantages enjoyed by the preferred embodiment apply here as well.

In conclusion, an improved apparatus for recirculating current through an inductive load has been described. Various embodiments were presented with embellishments corresponding to the particular inductive load requirement included. Certainly, those skilled in the art will recognize other applications that may take advantage of this approach with slight modifications. These apparatus offer a lower cost, higher reliability, smaller size, and significantly lower power dissipation solution to provide drive and recirculation currents to various inductive loads.

What is claimed is:

1. A low loss recirculation bridge apparatus for recirculating current through an inductive load having two terminals, said bridge apparatus comprising:

a first power terminal, and a second power terminal, said terminals for supplying current to said inductive load from a to-be-provided-power supply;

control means having a first output for providing a first control signal, a second output for providing a second control signal, a third output for providing a third control signal, and fourth output for providing a fourth control signal;

a first transistor having a first control input coupled to the first output of said control means, said first transistor coupled to the first power terminal, and coupled to a first of said two terminals of said inductive load, said first transistor for conducting a first drive current and a first recirculating current dependent on the first drive current from the first power terminal to a first of said two terminals of said inductive load, responsive to the first control signal at the first control input;

a second transistor having a second control input coupled to the second output of said control means, said second transistor having a second power input terminal coupled to the second power terminal, and a second power output terminal coupled to a second of said two terminals of said inductive load, said second transistor for conducting the first drive current from the second of two said terminals of said inductive load via the second power output terminal via the second power input terminal to the second power terminal, and for conducting a second recirculating current, dependent on a second drive current from the second power input terminal via said second transistor via the second power output terminal to the second of the two said terminals of said inductive load, the conduction of each of said first drive and second recirculating currents by said second transistor being at different times and being responsive to the second control signal at the second control input turning on said second transistor;

a third transistor having a third control input coupled to the third output of said control means, said third transistor having a third power input terminal coupled to the first power terminal, and a third power output terminal coupled to the second of said two terminals of said inductive load, said third transistor for conducting the second drive current from the first power terminal via the third power input terminal via the third power output terminal to the second of the two said terminals of said inductive load, and for conducting the first recirculating current from the second of two said terminals of said inductive load via the third power output terminal to the third power input terminal, the conduction of each of said second drive and first recirculating currents by said third transistor being at different times and being responsive to the third control signal at the third control input turning on said third transistor; and a fourth transistor having a fourth control input coupled to the fourth output of said control means, said fourth transistor having a fourth power input terminal coupled to the second power terminal, and a fourth power output terminal coupled to the first of said two terminals of said inductive load, said fourth transistor for conducting the second drive current from the first of said two terminals of said inductive load to the second power terminal, and the second recirculating current from the first of said two terminals of said inductive load via the fourth input terminal via the fourth output terminal to the second power terminal, the conduction of the second drive and second recirculating currents by said fourth transistor being at different times and being responsive to the fourth control signal at the fourth control input turning on said fourth transistor.

2. An apparatus for recirculating current through an inductive load having two terminals, the apparatus comprising:

a first power terminal, and a second power terminal, the terminals for supplying current to the inductive load from a to-be-provided power supply;

control means for providing a first control signal, a second control signal, and a third control signal;

a first transistor for conducting a first drive current and a first recirculating current dependent on the first drive current, wherein the first drive and first recirculating currents are conducted from the first power terminal to a first of the two terminals of the inductive load responsive to the first control signal at the first control input; and a second transistor for conducting the first drive current from a second of the two terminals of the inductive load to the second power terminal, and for conducting a second recirculating current, dependent on a second drive current, from the second power terminal to the second of the two terminals of the inductive load, wherein the first drive and second recirculating currents are conducted responsive to the second control signal.

3. An apparatus for recirculating current through an inductive load having two terminals, the apparatus comprising:

a first power terminal, and a second power terminal, the terminals for supplying current to the inductive load from a to-be-provided-power supply;

control means for providing a first control signal, a second control signal, and a third control signal;

a first transistor for conducting a first drive current and a first recirculating current dependent on the first drive current, wherein the first drive and first recirculating currents are conducted from the first power terminal to a first of the two terminals of the inductive load responsive to the first control signal at the first control input;

a second transistor for conducting the first drive current from a second of the two terminals of the inductive load to the second power terminal, and for conducting a second recirculating current, dependent on a second drive current, from the second power terminal to the second of the two terminals of the inductive load, wherein the first drive and second recirculating currents are conducted responsive to the second control signal; and a third transistor for conducting the second drive current and the first recirculating current, wherein the second drive current is conducted from the first power terminal to the second of the two terminals of the inductive load and the first recirculating current is conducted from the second of the two terminals of the inductive load to the first power terminal, wherein both the second drive current and the first recirculating current are conducted responsive to the third control signal.

4. An apparatus in accordance with claim 2 wherein the control means provides a fourth control signal, the apparatus further comprising:

a fourth transistor for conducting the second drive current from the first of the two terminals of the inductive load to the second power terminal, and for conducting the second recirculating current from the second of the two terminals of the inductive load to the second power terminal, wherein the second drive and second recirculating currents are conducted responsive to the fourth control signal.

* * * * *